US010991743B2

(12) United States Patent
Iwafuchi

(10) Patent No.: US 10,991,743 B2
(45) Date of Patent: Apr. 27, 2021

(54) SOLID STATE IMAGE PICKUP DEVICE AND PRODUCTION METHOD, SEMICONDUCTOR WAFER, AND ELECTRONIC APPARATUS

(71) Applicant: SONY CORPORATION, Tokyo (JP)

(72) Inventor: Toshiaki Iwafuchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 167 days.

(21) Appl. No.: 15/554,637

(22) PCT Filed: Feb. 26, 2016

(86) PCT No.: PCT/JP2016/055793
§ 371 (c)(1),
(2) Date: Aug. 30, 2017

(87) PCT Pub. No.: WO2016/143553
PCT Pub. Date: Sep. 15, 2016

(65) Prior Publication Data
US 2018/0240832 A1    Aug. 23, 2018

(30) Foreign Application Priority Data
Mar. 11, 2015    (JP) .............................. JP2015-048487

(51) Int. Cl.
*H01L 27/146*    (2006.01)
*H01L 23/544*    (2006.01)
(Continued)

(52) U.S. Cl.
CPC ........ *H01L 27/14632* (2013.01); *H01L 22/34* (2013.01); *H01L 23/544* (2013.01);
(Continued)

(58) Field of Classification Search
CPC ............. H01L 27/14603; H01L 27/307; H01L 51/0031; H01L 22/32; H01L 27/14601;
(Continued)

(56) References Cited

U.S. PATENT DOCUMENTS 9,343,508 B2 *    5/2016    Ichiki ................ H01L 27/14603
2004/0217397 A1 *    11/2004    Lee ......................... H01L 22/34
257/292
(Continued)

FOREIGN PATENT DOCUMENTS

JP    2002-176140 A    6/2002
JP    2006-202865 A    8/2006
(Continued)

OTHER PUBLICATIONS

International Search Report prepared by the Japan Patent Office dated May 10, 2016, for International Application No. PCT/JP2016/055793.
(Continued)

*Primary Examiner* — Omar F Mojaddedi
(74) *Attorney, Agent, or Firm* — Sheridan Ross P.C.

(57) ABSTRACT

The present technology relates to a solid state image pickup device and a production method, a semiconductor wafer, and an electronic apparatus by which the yield can be improved. On a semiconductor wafer, a chip region in which pixels and so forth that configure a solid state image pickup device are formed and a scribe region are formed. In the scribe region, a measuring region in which an inspection circuit for measuring a property of the chip region and measurement pads are formed and a dicing line to be cut upon fragmentation of the semiconductor wafer are provided. The measuring region is positioned between the dicing line and the chip region. The present technology can be applied to a solid state image pickup device.

20 Claims, 10 Drawing Sheets

(51) Int. Cl.
*H01L 23/532* (2006.01)
*H01L 23/58* (2006.01)
*H04N 5/369* (2011.01)
*H04N 5/374* (2011.01)
*H01L 21/66* (2006.01)

(52) U.S. Cl.
CPC .... *H01L 27/1469* (2013.01); *H01L 27/14634* (2013.01); *H01L 27/14636* (2013.01); *H01L 27/14687* (2013.01); *H04N 5/369* (2013.01); *H01L 2223/5446* (2013.01); *H04N 5/374* (2013.01)

(58) Field of Classification Search
CPC ....... H01L 27/14632; H01L 2924/0002; H01L 2924/00; H01L 27/14687; H01L 23/544; H01L 2223/5446; H04N 5/2253; H04N 5/374
See application file for complete search history.

(56) References Cited

U.S. PATENT DOCUMENTS

| | | | |
|---|---|---|---|
| 2004/0218076 A1* | 11/2004 | Lee | H01L 27/0207 348/294 |
| 2012/0056288 A1* | 3/2012 | Yoshihara | H01L 27/1469 257/431 |
| 2012/0205769 A1 | 8/2012 | Tsai et al. | |
| 2014/0077320 A1* | 3/2014 | Chen | H01L 27/1464 257/431 |
| 2015/0035109 A1 | 2/2015 | Kataoka | |
| 2015/0048352 A1 | 2/2015 | Ichiki | |
| 2016/0064323 A1* | 3/2016 | Sekikawa | H01L 27/14636 257/751 |
| 2016/0172405 A1* | 6/2016 | Hori | H01L 27/14636 257/432 |

FOREIGN PATENT DOCUMENTS

| | | |
|---|---|---|
| JP | 2013-211291 | 10/2013 |
| JP | 2013-219319 A | 10/2013 |
| TW | 201347153 | 11/2013 |

OTHER PUBLICATIONS

Official Action (no English translation available) for Japanese Patent Application No. 2017-504974, dated Apr. 28, 2020, 8 pages.
Official Action (with English translation) for China Patent Application No. 201880011455.0, dated Dec, 31, 2020, 17 pages.

* cited by examiner

SOLID STATE IMAGE PICKUP DEVICE AND PRODUCTION METHOD, SEMICONDUCTOR WAFER, AND ELECTRONIC APPARATUS

CROSS REFERENCE TO RELATED APPLICATIONS

This application is a national stage application under 35 U.S.C. 371 and claims the benefit of PCT Application No. PCT/JP2016/055793 having an international filing date of 26 Feb. 2016, which designated the United States, which PCT application claimed the benefit of Japanese Patent Application No. 2015-048487 filed 11 Mar. 2015, the disclosures of which are incorporated herein by reference in their entirety.

TECHNICAL FIELD

The present technology relates to a solid state image pickup device and a production method, a semiconductor wafer, and an electronic apparatus, and particularly to a solid state image pickup device and a production method, a semiconductor wafer and an electronic apparatus by which the yield can be improved.

BACKGROUND ART

Upon production of a solid state image pickup device such as, for example, a CMOS (Complementary Metal Oxide Semiconductor) image sensor or the like, after a plurality of chips each of which is a solid state image pickup device are formed in a semiconductor wafer by stacking, the semiconductor wafer is fragmented by dicing.

A technology is known wherein, in order to measure a property of such a chip as described above to perform determination of whether or not the chip is good, a property of a chip is measured using an inspection circuit in a state in which a semiconductor wafer is not yet in a fragmented state.

For example, an inspection circuit that generates a signal for property measurement to be supplied to a circuit block of each chip and supplies the signal to the circuit block of the chip to measure a property and a technology for forming a pad connected to the inspection circuit in a scribe region of a semiconductor wafer have been proposed (for example, refer to PTL 1).

CITATION LIST

Patent Literature

[PTL 1]
JP 2002-176140 A

SUMMARY

Technical Problem

However, according to the technology described above, it is difficult to improve the yield upon production of solid state image pickup devices.

For example, if a pad for inspection to be connected to an inspection circuit is formed in a scribe region, a step appears at a location of the pad. Further, it is necessary to provide, just below a pad for inspection, a Cu (copper) pattern of a thick Global layer or some other Cu pattern for the object of strength reinforcement.

In this case, if it is tried to cut a scribe region, for example, by blade dicing, chipping (missing) sometimes occurs at the stepped location of a pad or clogging occurs with the dicing blade at a location of a Cu pattern to cause chipping. If such chipping occurs, a circuit or the like of the solid state image pickup device is sometimes broken, resulting in degradation of the yield.

Further, for example, according to the technology described above, since an inspection circuit is formed in a scribe region, a layer of Si (silicon) exists in the surface layer in the scribe region. Accordingly, where the scribe region is cut, for example, by laser ablation dicing, upon laser processing, Si and Cu in the Cu pattern are melted to form Cu silicide in the scribe region.

In the Cu silicide generated in this manner, the reaction proceeds even at room temperature such that the Cu silicide grows in such a manner as to change the state thereof, making a cause of dust. Such dust causes a pixel defect in the solid state image pickup device, resulting in degradation of the yield. Especially, if Si exists at a location of a scribe region of a layer of a semiconductor wafer on which pixels are to be formed, a pixel defect is likely to occur.

The present technology is made in view of such a situation as described above and makes it possible to improve the yield of solid state image pickup devices upon production.

Solution to Problem

A solid state image pickup device according to a first aspect of the present technology includes a chip region in which a plurality of pixels and elements for driving the pixels are provided, and a measuring region that is provided in a neighboring relationship with the chip region and in which the elements and wiring lines necessary for driving of the pixels are not provided but measurement pads for measuring a property of the chip region therethrough are provided.

In the measuring region, connection wiring lines for connecting an inspection circuit for measuring the property and the measurement pads to each other can be further provided.

In the measuring region, the inspection circuit can be further provided.

A production method according to the first aspect of the present technology is a production method for a solid state image pickup device that includes a chip region in which a plurality of pixels and elements for driving the pixels are provided, and a measuring region that is provided in a neighboring relationship with the chip region and in which the elements and wiring lines necessary for driving of the pixels are not provided but measurement pads for measuring a property of the chip region therethrough are provided, the production method including the steps of forming, on a semiconductor wafer, a plurality of regions including the chip region and the measuring region and a dicing line that partitions the plurality of regions from each other, and performing a dicing process for the dicing line to fragment the semiconductor wafer into the solid state image pickup device configured from the chip region and the measuring region.

The semiconductor wafer can be configured from a sensor wafer on which the pixels are provided and one or a plurality of different wafers different from the sensor wafer, and the dicing process can be performed after silicon at the dicing line location of the sensor wafer is removed.

In the measuring region, an inspection circuit for measuring the property can be further provided.

At the dicing line location of each of the different wafers, an inspection circuit for measuring the property can be further provided.

A coverage of copper in the dicing line can be lower than a coverage of copper in a region different from the dicing line.

In the first aspect of the present technology, the solid state image pickup device includes a chip region in which a plurality of pixels and elements for driving the pixels are provided, and a measuring region that is provided in a neighboring relationship with the chip region and in which the elements and wiring lines necessary for driving of the pixels are not provided but measurement pads for measuring a property of the chip region therethrough are provided.

A semiconductor wafer according to a second aspect of the present technology includes a chip region in which a plurality of pixels and elements for driving the pixels are provided, a measuring region that is provided in a neighboring relationship with the chip region and in which the elements and wiring lines necessary for driving of the pixels are not provided but measurement pads for measuring a property of the chip region therethrough are provided, and a dicing line that partitions a plurality of regions including the chip region and the measuring region.

The semiconductor wafer can be configured from a sensor wafer on which the pixels are provided and one or a plurality of different wafers different from the sensor wafer, and the dicing line location of the sensor wafer can be in a state in which silicon is removed therefrom.

In the measuring region, an inspection circuit for measuring the property can be further provided.

At the dicing line location of each of the different wafers, an inspection circuit for measuring the property can be further provided.

A coverage of copper in the dicing line can be lower than a coverage of copper in a region different from the dicing line.

In the second aspect of the present technology, the semiconductor wafer includes a chip region in which a plurality of pixels and elements for driving the pixels are provided, a measuring region that is provided in a neighboring relationship with the chip region and in which the elements and wiring lines necessary for driving of the pixels are not provided but measurement pads for measuring a property of the chip region therethrough are provided, and a dicing line that partitions a plurality of regions including the chip region and the measuring region.

An electronic apparatus according to a third aspect of the present technology includes a solid state image pickup device, which includes a chip region in which a plurality of pixels and elements for driving the pixels are provided, and a measuring region that is provided in a neighboring relationship with the chip region and in which the elements and wiring lines necessary for driving of the pixels are not provided but measurement pads for measuring a property of the chip region therethrough are provided.

In the third aspect of the present technology, the solid state image pickup device includes a chip region in which a plurality of pixels and elements for driving the pixels are provided, and a measuring region that is provided in a neighboring relationship with the chip region and in which the elements and wiring lines necessary for driving of the pixels are not provided but measurement pads for measuring a property of the chip region therethrough are provided.

Advantageous Effect of Invention

According to the first aspect to the third aspect of the present technology, the yield can be improved.

DESCRIPTION OF EMBODIMENTS

In the following, embodiments to which the present technology is applied are described.

<First Embodiment>
<Example of Configuration of Semiconductor Wafer>

Figure 1:
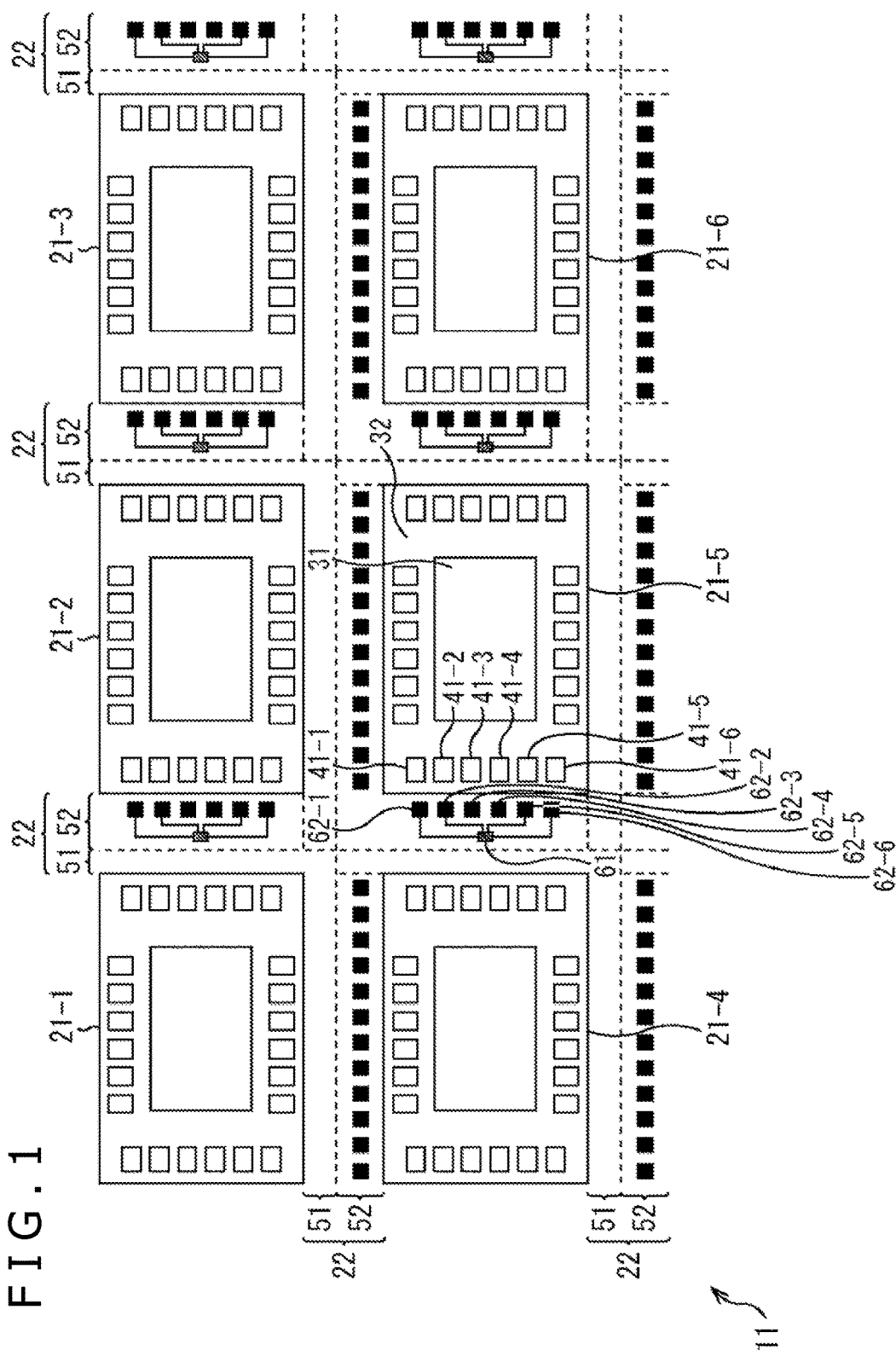
FIG. 1 is a view depicting an example of a configuration of a semiconductor wafer.

FIG. 1 is a view depicting an example of a configuration of an embodiment of a semiconductor wafer to which the present technology is applied. It is to be noted that, more particularly, only a portion of the semiconductor wafer is depicted in FIG. 1.

On the semiconductor wafer 11 depicted in FIG. 1, chip regions from a chip region 21-1 to a chip region 21-6 in each of which pixel circuits, wiring lines and so forth that configure a solid state image pickup device are formed by stacking are provided. In addition, regions between neighboring ones of the chip regions from the chip region 21-1 to the chip region 21-6 serve as scribe regions 22. It is to be noted that, in the following description, where there is no necessity to particularly distinguish the chip regions from the chip region 21-1 to the chip region 21-6 from each other, each of them is merely referred to also as chip region 21.

For example, the chip region 21-5 is configured from a pixel region 31 in which pixels that receive light incident thereto and photoelectrically converts the light are arranged in rows and columns, and a peripheral region 32 that surrounds the pixel region 31.

In the pixel region 31, pixel circuits each configured from a photoelectric conversion element and a pixel driving element such as a transistor are formed, and wiring lines not depicted and pads such as pads from a pad 41-1 to a pad 41-6 that allow electric connection to the outside and so forth are provided in the peripheral region 32. In the following description, where there is no necessity to particularly distinguish the pads from the pad 41-1 to the pad 41-6 from each other, each of them is merely referred to also as pad 41.

Further, in the scribe region 22, a dicing line 51 that is a region to be severed (cut) upon dicing processing and a measuring region 52 in which an inspection circuit and measurement pads for inspection electrically connected to the inspection circuit are formed are provided.

The dicing lines 51 are regions that partition a plurality of regions formed on the semiconductor wafer 11 and each configured from a chip region 21, which serves as a solid state image pickup device after fragmentation, and a measuring region 52.

Meanwhile, the measuring region 52 is a region in which an element or a wiring line necessary for driving of a solid state image pickup device, namely, for driving of pixels provided in the chip region 21, is not provided but only a circuit and a member for measuring a property of the chip region 21 such as an inspection circuit and a measurement pad are provided.

For example, in the figure of the chip region 21-5, at the upper side and the left side, the measuring region 52 is provided in a neighboring relationship with the chip region 21-5 between the chip region 21-5 and the dicing line 51. Further, at a location of the measuring region 52 neighboring with the chip region 21-5 at the left side in the figure, an inspection circuit 61 and measurement pads from a measurement pad 62-1 to a measurement pad 62-6 are provided.

Here, the inspection circuit 61 is a circuit called TEG (Test Element Group) and is a circuit for monitoring the film thickness of the chip region 21 and measuring basic property values of the chip region 21 such as a resistance value of the circuits, wiring lines and so forth formed in the chip region 21. In the present example, the inspection circuit 61 is connected to the measurement pads from the measurement pad 62-1 to the measurement pad 62-6 by wiring lines. It is to be noted that, in the following description, where there is no necessity to particularly distinguish the measurement pads from the measurement pad 62-1 to the measurement pad 62-6 from each other, each of them is simply referred to also as measurement pad 62.

Upon measurement of a predetermined property value of the chip region 21-5, a measurement pad 62 and a pad 41 are electrically connected to each other, for example, by a probe to electrically connect the inspection circuit 61 and the chip region 21-5 to each other and the inspection circuit 61 is driven to perform measurement of the desired property.

In such a semiconductor wafer 11 as described above, while pixel circuits and so forth are formed in the chip regions 21 by stacking, measurement of a property is performed suitably by the inspection circuits 61 and so forth. Then, if necessary circuits such as the pixel circuit and so forth and wiring lines are formed in the chip regions 21, dicing is thereafter performed to fragment the semiconductor wafer 11 into chips.

Figure 2:
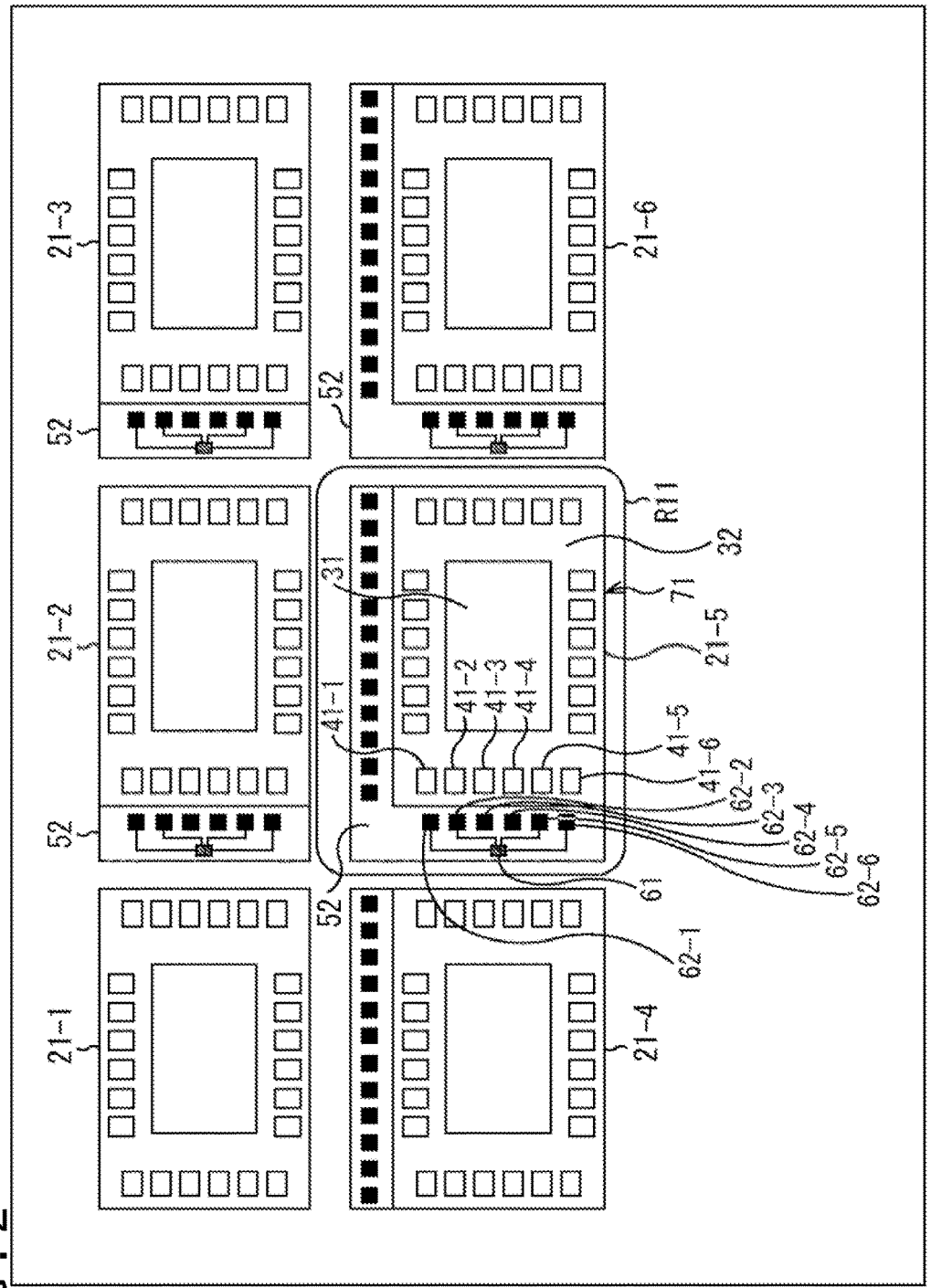
FIG. 2 is a view illustrating fragmentation of the semiconductor wafer.

Consequently, the chip regions 21 are separated from the semiconductor wafer 11, for example, as depicted in FIG. 2. In the present example, for example, by the fragmentation (dicing), the chip region 21-5 and a location of the measuring region 52 which neighbors with the chip region 21-5 are formed as one chip, and this chip forms a solid state image pickup device 71. In short, a location of the semiconductor wafer 11 in a region R11 becomes the solid state image pickup device 71.

Here, the measuring region 52 is a region in which only circuits and pads necessary for measurement of a property of the chip region 21 such as the inspection circuit 61 and the measurement pads 62 are formed while elements, wiring lines and so forth necessary for operation of the solid state image pickup device 71 are not provided. Therefore, the measuring region 52 is a region that is not especially required after the fragmentation. Accordingly, after the fragmentation is performed, the location of the measuring region 52 may be removed from the chip while only the location of the chip region 21 is formed as the final solid state image pickup device 71.

<Cross Section of Scribe Region>

Figure 3:
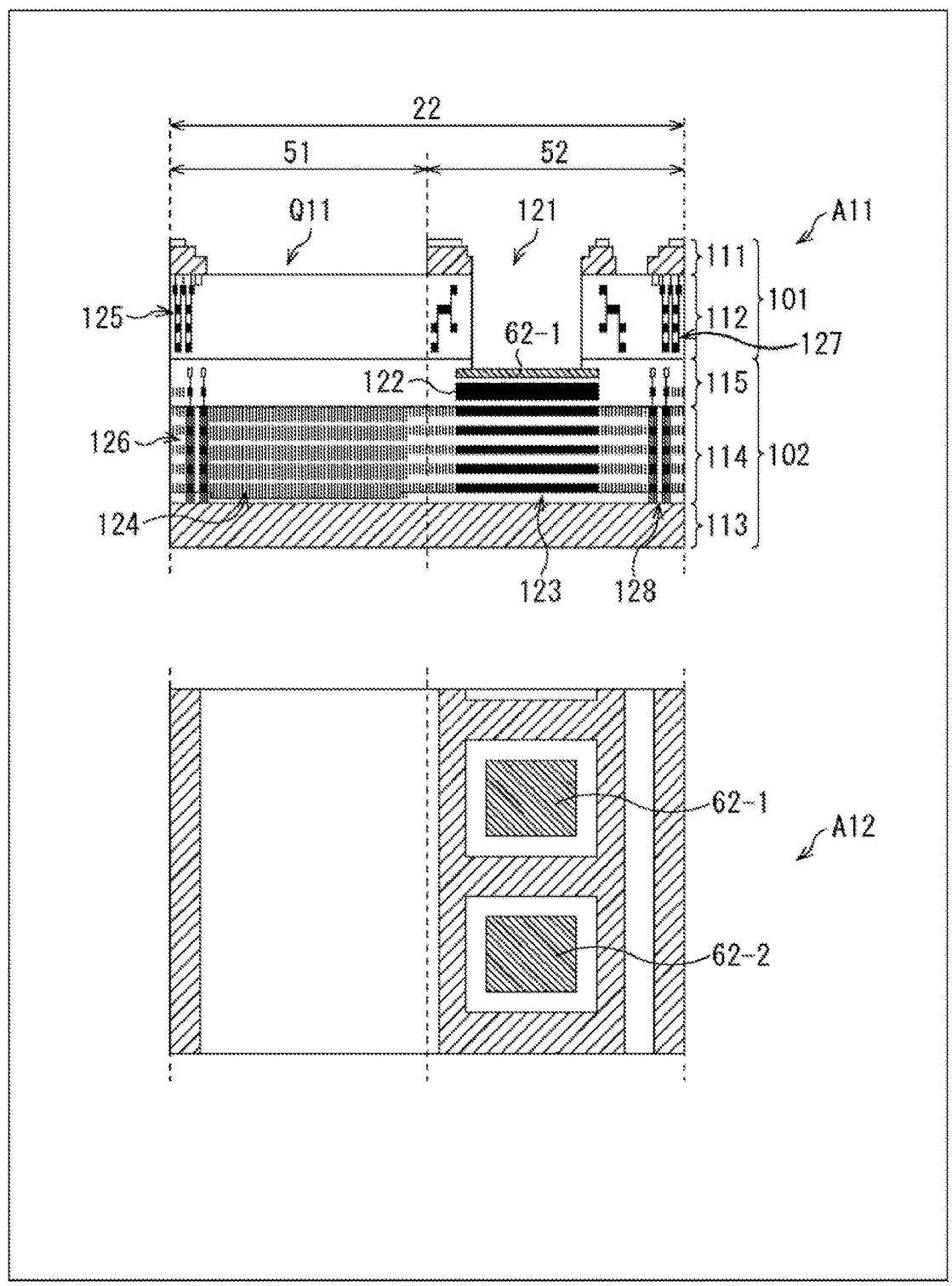
FIG. 3 is a view depicting a cross section of a scribe region.

Further, the scribe region 22 has such a cross section, for example, as depicted in FIG. 3. It is to be noted that, in FIG. 3, elements corresponding to those in the case of FIG. 1 are denoted by the same reference signs and description of them is suitably omitted herein.

In FIG. 3, a view indicated by an arrow mark A11 depicts a cross section of the scribe region 22, and a view indicated by another arrow mark A12 is a view when the view indicated by the arrow mark A11 is viewed in the downward direction from above in the figure. In short, the view indicated by the arrow mark A12 is a view when the scribe region 22 is viewed in a direction same as that in the case of FIG. 1.

As indicated by the arrow mark A11, the semiconductor wafer 11 is configured from a sensor wafer 101 and a logic wafer 102, and the sensor wafer 101 and the logic wafer 102 are pasted together, for example, by plasma bonding or the like.

Here, the sensor wafer 101 is a semiconductor wafer on which pixels each formed from a photoelectric conversion element and so forth are provided in the chip region 21 such that an image pickup function is implemented. Meanwhile, the logic wafer 102 is a semiconductor wafer on which a logic circuit for performing various signal processes such as a signal process for a pixel signal read out from the pixels is formed in the chip region 21.

The sensor wafer 101 is configured from a silicon substrate 111 made of Si or the like, and a wiring line layer 112 formed from SiOx (silicon oxide) stacked on the silicon substrate 111.

Meanwhile, the logic wafer 102 is configured from a silicon substrate 113 made of Si or the like, a wiring line layer 114 formed from a low dielectric constant insulating film (Low-K) of SiOC or the like, and another wiring line layer 115 made of SiO.

In the present example, at a location of the measuring region 52 of the wiring line layer 115, the measurement pad 62-1 made of Al (aluminum) is formed, and a location of the measurement pad 62-1 is open by an opening 121 provided in the sensor wafer 101 and the logic wafer 102.

Further, just below the measurement pad 62-1 at the location of the measuring region 52 of the wiring line layer 115, a Cu pattern 122 made of Cu of a thick Global layer is provided for the object of strength reinforcement at the location of the measurement pad 62-1. Furthermore, just below the Cu pattern 122 at the location of the measuring region 52 of the wiring line layer 114, a Cu pattern 123 configured from a measurement pad of Cu for measuring a property of the chip region 21, a pad of Cu for strength reinforcement and so forth is provided.

Although the Cu pattern 123 has a certain thickness and area, the thickness of the Cu pattern 123 in the vertical direction in the figure is smaller than the thickness of the Cu pattern 122. In other words, the wiring line layer 114 is a wiring line layer on which the Cu pattern 123 having a smaller thickness than that of the Cu pattern 122 that is formed on the wiring line layer 115 is formed.

At a location of the dicing line 51 of the sensor wafer 101, more particularly, at a portion of the sensor wafer 101 in a region that is to be cut upon dicing, Si configuring the silicon substrate 111 is removed fully by etching or the like as indicated by an arrow mark Q11. Therefore, at the location of the dicing line 51 of the sensor wafer 101, SiO configuring the wiring line layer 112 is exposed.

If this location is viewed from above in the figure, it can be recognized that Si does not exist at the surface location of the dicing line 51 as indicated by the arrow mark A12. It is to be noted that, in the view indicated by the arrow mark A12, a region indicated by slanting lines in a left oblique direction indicates the region of Si.

Furthermore, at the location of the dicing line 51 at the wiring line layer 112 and the wiring line layer 115, a wiring line, a pad or the like is not provided in order to facilitate cutting upon dicing. In short, nothing is provided.

At the location of the dicing line 51 of the wiring line layer 114, a dummy Cu pattern 124 made of Cu of a small thickness is provided. The Cu pattern 124 is formed such that the coverage of the wiring line layer 114 is lower than that of the Cu pattern of any other location such as the location at which the Cu pattern 123 is provided, namely, the location of the measuring region 52 and so forth, for example, such that the coverage of the wiring line layer 114 is approximately equal to or lower than 30%. Here, the coverage of a Cu pattern is a ratio of the Cu area per unit area.

Further, in the proximity of the boundary between the sensor wafer 101 and the chip region 21 of the logic wafer 102, guard rings from a guard ring 125 to a guard ring 128 of Cu for preventing unintended electric connection (short-circuiting) in the chip region 21 are provided.

By configuring the semiconductor wafer 11 in such a manner as described above, the yield of solid state image pickup devices upon production can be improved more simply.

In particular, if the measurement pad 62 is provided on the dicing line 51, since a step is generated at the location of the measurement pad 62 or the Cu pattern 122 or the Cu pattern 123 for the object of strength reinforcement is arranged just below the measurement pad 62, chipping occurs when dicing is performed. If such chipping occurs, then in some cases, a circuit or the like of the solid state image pickup device is damaged and the yield degrades.

Therefore, the semiconductor wafer 11 is configured such that a measuring region 52 is provided between a dicing line 51 and a chip region 21 and a measurement pad 62 is arranged in the measuring region 52. In other words, the semiconductor wafer 11 is formed in a scribe structure wherein a dicing line 51 to be cut upon dicing and a line in which a plurality of measurement pads 62 that are used for measurement upon inspection are provided are separated as different lines from each other.

This eliminates the necessity to provide a measurement pad 62, a Cu pattern 122, another Cu pattern 123 and so forth in the dicing line 51. Consequently, it is possible to prevent occurrence of chipping arising from the measurement pad 62, Cu pattern 122, Cu pattern 123 and so forth and improve the yield of solid state image pickup devices upon production.

Besides, a Global layer or a Semi Global layer in which a Cu pattern has a great thickness, namely, the wiring line layer 115, is configured such that also a dummy wiring line of Cu is arranged at a location of the dicing line 51. In addition, the dicing line 51 is configured such that only a Cu pattern (dummy wiring line of Cu) having a low coverage of Cu like the Cu pattern 124 is arranged therein. By using such a configuration as just described, the volume of Cu in the dicing line 51 can be suppressed low.

Accordingly, since the number of times of dressing of a blade upon blade dicing can be reduced and besides dicing processing can be performed simply, occurrence of chipping can be suppressed. At this time, even if chipping occurs in the dicing line 51, since the measuring region 52 is provided between the dicing line 51 and the chip region 21 and also a guard ring is provided in the proximity of the boundary of the chip region 21, such a situation that the solid state image pickup device is damaged by occurrence of chipping does not occur.

Further, by arranging only the Cu pattern 124, which has a low coverage of Cu, in the dicing line 51, when laser ablation dicing is performed, occurrence of Cu silicide can be reduced. By this, the yield of solid state image pickup devices can be improved.

Furthermore, in the semiconductor wafer 11, Si on the dicing line 51, more particularly, at the location of the dicing line 51 of the sensor wafer 101 on which pixels are formed, is removed fully by etching or the like before dicing processing.

Therefore, also when laser ablation dicing is performed, Cu silicide is not generated in the sensor wafer 101. Consequently, occurrence of a pixel defect by debris (dust) of Cu silicide can be prevented and the yield of solid state image pickup devices can be improved. In other words, occurrence of initial failures caused by debris of Cu silicide or deterioration of the reliability by growth of debris can be suppressed to improve the yield. Further, a solid state image pickup device of high picture quality can therefore be obtained.

Furthermore, by removing Si existing at the location of the dicing line 51 before dicing processing, when laser ablation dicing is performed, the processing can be performed more simply and rapidly.

Generally, since laser light is less likely to be absorbed by a location of Si, although the processing speed (cutting speed) by laser light is decreased at the Si location, Si on the surface of the dicing line 51 in the semiconductor wafer 11 is removed. Therefore, it is possible to further increase the processing speed by laser light upon dicing of the semiconductor wafer 11 and perform fragmentation in a shorter period of time.

It is to be noted that, although, in the description of the semiconductor wafer 11, an example wherein a TEG such as the inspection circuit 61 is provided in the measuring region 52 is described, confidentially it sometimes is necessary to destroy such a TEG as described above by dicing. In such a case as just described, a TEG such as the inspection circuit 61 may be formed at the location of the dicing line 51 in the logic wafer 102 and the TEG such as the inspection circuit 61 and the measurement pad 62 may be connected to each other by a wiring line.

In this case, since a region of Si does not exist at the location of the dicing line 51 of the sensor wafer 101, Cu silicide is not generated on the sensor wafer 101, and the yield can be improved.

<Production of Solid State Image Pickup Device>

In the following, production of a solid state image pickup device to which the present technology is applied is described.

Figure 4:
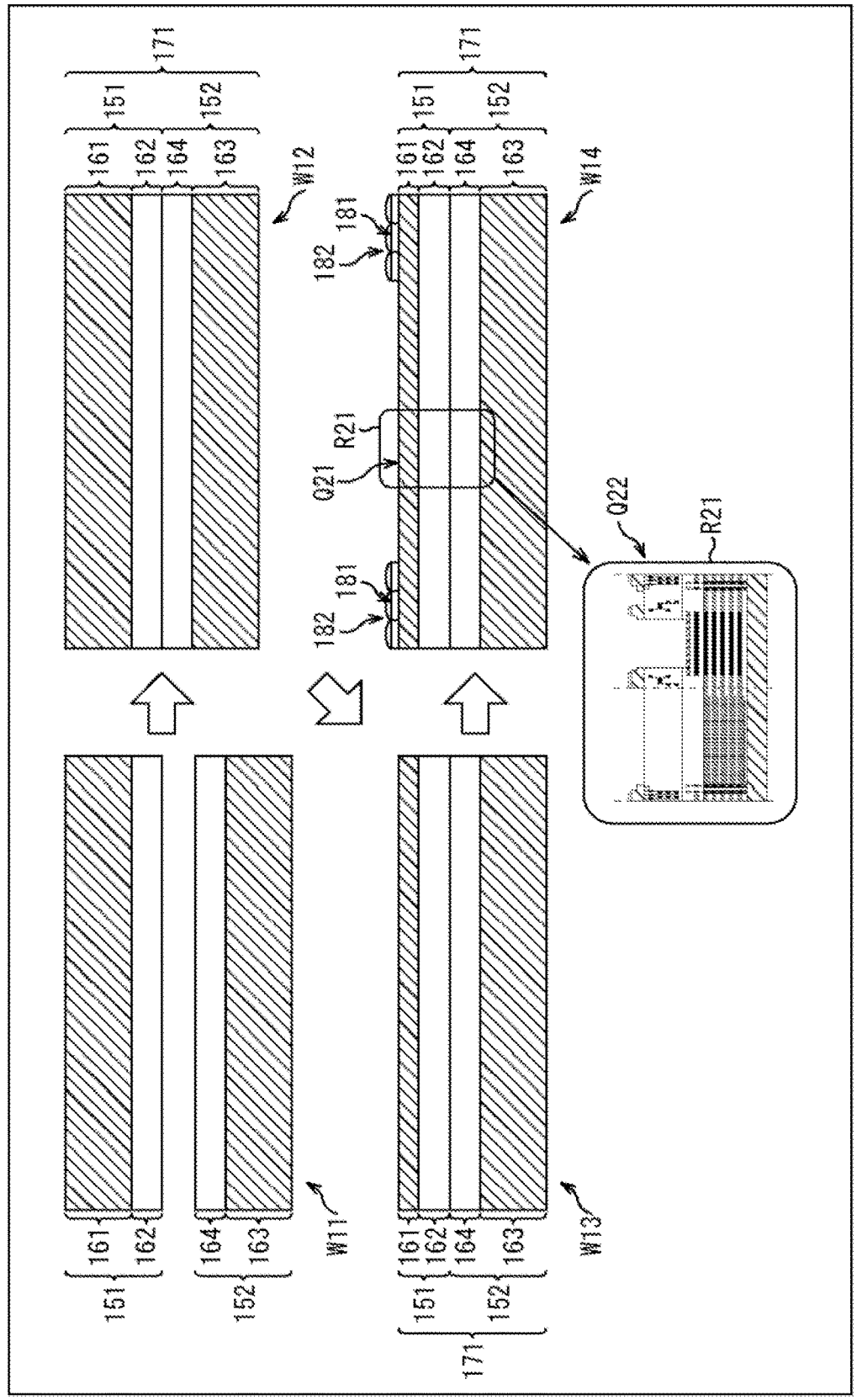
FIG. 4 is a view illustrating production steps of a solid state image pickup device.

A production apparatus that produces a solid state image pickup device first produces a sensor wafer 151 and a logic wafer 152 as indicated by an arrow mark W11 of FIG. 4.

In particular, the production apparatus forms pixels each configured from a photoelectric conversion element and so forth on a silicon substrate 161 and forms a wiring line layer 162 having wiring lines and so forth and configured from one or a plurality of layers on the silicon substrate 161 by stacking thereby to form one wafer including the silicon substrate 161 and the wiring line layer 162 as a sensor wafer 151.

Here, the sensor wafer 151, silicon substrate 161 and wiring line layer 162 correspond to the sensor wafer 101, silicon substrate 111 and wiring line layer 112 depicted in FIG. 3, respectively.

Further, the production apparatus forms a wiring line layer 164 having wiring lines and so forth and formed from one or a plurality of layers on a silicon substrate 163 by stacking thereby to form one wafer including the silicon substrate 163 and the wiring line layer 164 as a logic wafer 152.

Here, the logic wafer 152, silicon substrate 163 and wiring line layer 164 correspond to the logic wafer 102, silicon substrate 113 and wiring line layer including the wiring line layer 114 and the wiring line layer 115 depicted in FIG. 3, respectively.

Then, the production apparatus joins the sensor wafer 151 and the logic wafer 152 together by plasma bonding to form one semiconductor wafer 171 as indicated by an arrow mark W12.

In the present example, the sensor wafer 151 and the logic wafer 152 are joined together such that the wiring line layer 162 of the sensor wafer 151 and the wiring line layer 164 of the logic wafer 152 are opposed to each other.

Here, the semiconductor wafer 171 corresponds to the semiconductor wafer 11 depicted in FIG. 1, and regions corresponding to the plurality of chip regions 21 described hereinabove and regions corresponding to the scribe regions 22 are formed on the semiconductor wafer 171.

Further, as indicted by an arrow mark W13, the production apparatus processes the surface of the silicon substrate 161, which configures the semiconductor wafer 171, to form the silicon substrate 161 into a thinner layer.

Thereafter, the production apparatus forms, for each pixel, an on-chip color filter 181 and an on-chip color lens 182 that configure the pixel in a region corresponding to a chip region 21 of the semiconductor wafer 171 as indicated by an arrow mark W14.

Further, the production apparatus etches locations of the dicing lines of the sensor wafer 151 to remove Si and forms openings at measuring region locations of the sensor wafer 151 and the logic wafer 152 to open measurement pad locations.

Consequently, on the semiconductor wafer 171, a plurality of regions each configured from a chip region and a measuring region to be made a solid state image pickup device are formed and dicing lines that partition the plurality of regions are formed.

For example, a location of the semiconductor wafer 171 indicated by an arrow mark Q21 is formed as a scribe region. In the present example, if the location of the scribe region, namely, the location of a region R21, is enlarged, then the structure of the scribe region is a structure similar to that in the case of the arrow mark A11 of FIG. 3 as indicated by an arrow mark Q22. In FIG. 4, a location indicated by the arrow mark Q22 is a location that indicates the location of the region R21 of the semiconductor wafer 171 in an enlarged scale.

After one semiconductor wafer 171 is obtained in this manner, the semiconductor wafer 171 is fragmented by dicing, and chips obtained as a result of the fragmentation form solid state image pickup devices. In the dicing, the location of a dicing line is cut by the dicing process as described above, and a chip configured from a chip region and a measuring region forms a solid state image pickup device. At this time, as occasion demands, the location of the measuring region is removed from the chip.

<Second Embodiment>
<Cross Section of Scribe Region>

It is to be noted that, although the foregoing description is directed to an example in which a semiconductor wafer on which a plurality of solid state image pickup devices (chip regions) are formed is a wafer obtained by bonding a sensor wafer and a logic wafer together, a semiconductor wafer may be obtained by bonding three or more wafers together.

Figure 5:
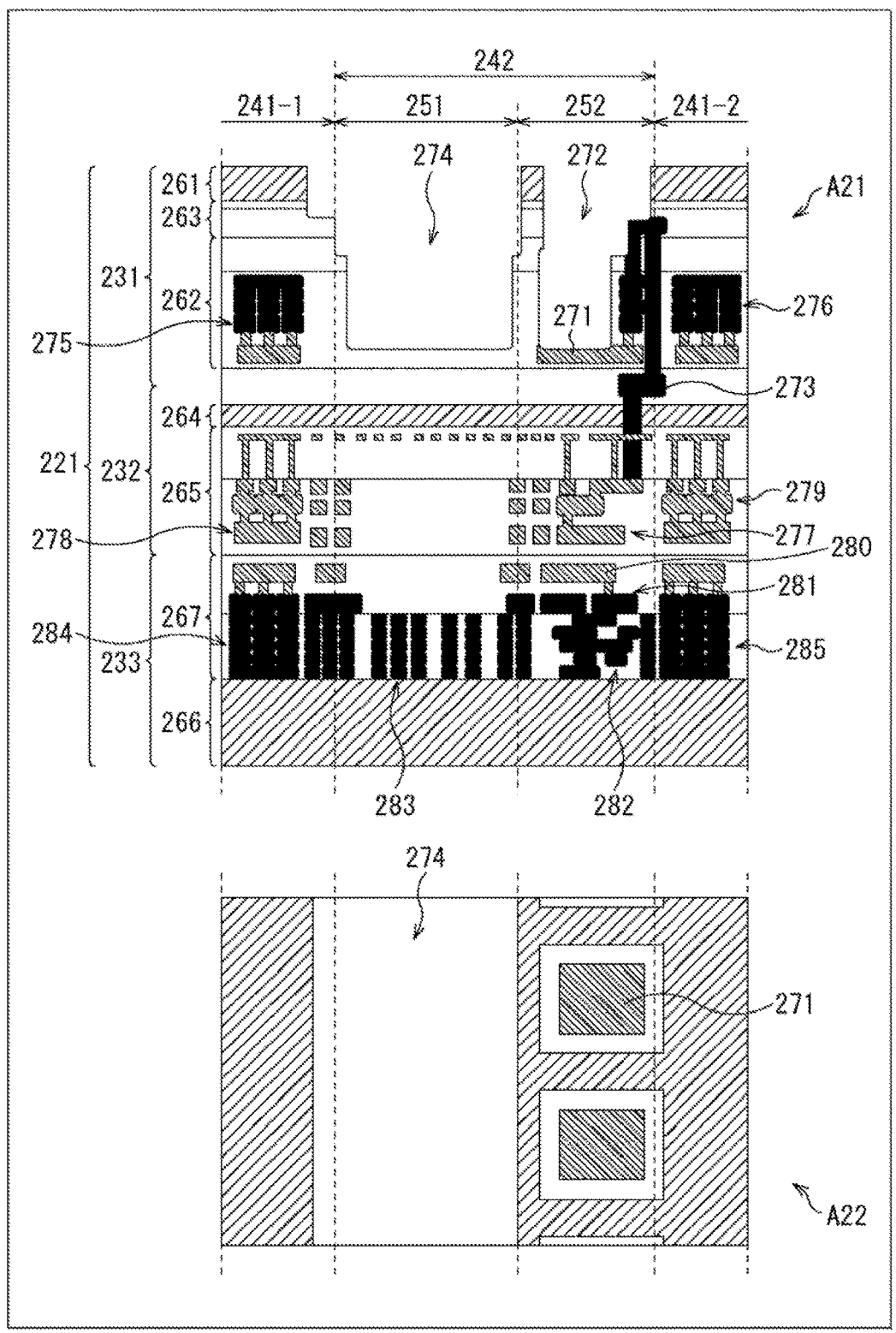
FIG. 5 is a view depicting a cross section of a scribe region.

For example, if a final semiconductor wafer to which the present technology is applied is obtained by bonding three semiconductor wafers together, the scribe region of the semiconductor wafer has, for example, such a cross section as depicted in FIG. 5.

In the present example, the semiconductor wafer 221 is obtained by bonding three semiconductor wafers, namely, a sensor wafer 231, a DRAM (Dynamic Random Access Memory) wafer 232 and a logic wafer 233.

It is to be noted that, in FIG. 5, a view indicated by an arrow mark A21 depicts a cross section of the scribe region, and a view indicated by another arrow mark A22 is a view when the view indicated by the arrow mark A21 is viewed in the downward direction from above in the figure.

Referring to FIG. 5, the sensor wafer 231 and the logic wafer 233 correspond to the sensor wafer 101 and the logic wafer 102 depicted in FIG. 3, respectively. Further, the DRAM wafer 232 arranged between the sensor wafer 231 and the logic wafer 233 is a semiconductor wafer in which a location of the chip region which is to configure a solid state image pickup device is a region that functions as a memory.

On the semiconductor wafer 221, pixel circuits, wiring lines and so forth are formed and a chip region 241-1 and another chip region 241-2 that form part of a solid state image pickup device are formed while a region between the chip region 241-1 and the chip region 241-2 forms a scribe region 242. Further, in the scribe region 242, a dicing line 251 and a measuring region 252 are provided.

The chip region 241-1 and the chip region 241-2 correspond to the chip region 21 depicted in FIG. 1, and the dicing line 251 and the measuring region 252 correspond to the dicing line 51 and the measuring region 52 depicted in FIG. 3, respectively.

It is to be noted that, in the following description, where there is no necessity to particularly distinguish the chip region 241-1 and the chip region 241-2 from each other, each of them is referred to merely as chip region 241.

The sensor wafer 231 has a silicon substrate 261 made of Si and a wiring line layer 262 formed from a plurality of layers stacked on the silicon substrate 261, and an insulating layer 263 formed from an oxide film is provided between the silicon substrate 261 and the wiring line layer 262.

Meanwhile, the DRAM wafer 232 has a silicon substrate 264 made of Si and a wiring line layer 265 formed from a plurality of layers stacked on the silicon substrate 264. Further, the logic wafer 233 has a silicon substrate 266 made of Si and a wiring line layer 267 formed from a plurality of layers stacked on the silicon substrate 266.

In the present example, a measurement pad 271 made of Al is formed at a location of the measuring region 252 of the wiring line layer 262 of the sensor wafer 231, and a location of the measurement pad 271 is open by an opening 272 provided in the sensor wafer 231.

The measurement pad 271 corresponds to the measurement pad 62 depicted in FIG. 3. The measurement pad 271 is electrically connected to a wiring line and a pad of Al provided at a location of the measuring region 252 of the wiring line layer 265 of the DRAM wafer 232 by a wiring line 273 of Cu formed from a via or an electrode.

Further, at a location of the dicing line 251 of the sensor wafer 231, a deep groove 274 is formed by removing not only a location of the silicon substrate 261 but also most part of the wiring line layer 262 by etching or the like.

The location of the groove 274 is a location to be cut upon dicing, and at the location of the groove 274, Si is removed fully as indicated by the arrow mark A22 similarly as in the example indicated by the arrow mark A12 of FIG. 3. It is to be noted that, also in the view indicated by the arrow mark A22, a region of slanting lines in a left oblique direction indicates a region of Si.

When a semiconductor wafer is to be fragmented by dicing, as the thickness of the semiconductor wafer increases, dicing of the semiconductor wafer becomes less easy. Therefore, the semiconductor wafer 221 is configured such that the deep groove 274 is formed in the dicing line 251 to reduce the thickness at the location of the dicing line 251 thereby to make it possible to perform fragmentation more simply.

Further, at a location of the chip region 241 of the wiring line layer 262 of the sensor wafer 231, a guard ring 275 and another guard ring 276 are formed from Cu or Al at a location in the proximity of the boundary of the dicing line 251 or the measuring region 252.

In the DRAM wafer 232, an Al pattern 277 formed from wiring lines, pads and so forth of Al is formed at a location of the measuring region 252 of the wiring line layer 265. This Al pattern 277 is connected to the measurement pad 271 by the wiring line 273 of Cu.

Also in the DRAM wafer 232, a guard ring 278 and another guard ring 279 are formed from Al at a location in the proximity of the boundary of the dicing line 251 or the measuring region 252 at a location of the chip region 241 of the wiring line layer 265.

In the logic wafer 233, a measurement pad 280 of Al is formed at a location of the measuring region 252 of the wiring line layer 267, and just below the measurement pad 280, a Cu pattern 281 configured from Cu having a thick Global layer is provided for the object of strength reinforcement of the location of the measurement pad 280. In the present example, the measurement pads such as the measurement pad 280, measurement pad 271 and so forth for being used for measurement (inspection) of a property of the chip region 241 are all arranged on the same line, namely, in the measuring region 252.

Further, just below the Cu pattern 281 at the location of the measuring region 252 of the wiring line layer 267, a Cu pattern 282 of a pad and so forth of Cu for strength reinforcement is provided.

In the wiring line layer 267, a layer on which the Cu pattern 282 is formed is a wiring line layer formed from a low dielectric constant insulating film (Low-K) of SiOC or the like. It is to be noted that, in the present example, on the DRAM wafer 232, a wiring line layer configured from a low dielectric constant insulating film (Low-K) of SiOC or the like is not provided, and the wiring line layer 265 of the DRAM wafer 232 is configured only from a layer on which wiring lines of Al are provided. Especially, at a location of the dicing line 251 of the wiring line layer 265, a dummy wiring line of Al is not arranged either. However, since Al does not give rise to debris to grow, a dummy wiring line of Al may be arranged at a location of the dicing line 251 of the wiring line layer 265.

Further, at the location of the dicing line 251 of the wiring line layer 267, more particularly, in a layer same as the layer on which the Cu pattern 282 is formed, a Cu pattern 283 having a low coverage of Cu is formed.

Also the Cu pattern 283 is formed such that, similarly as in the case of the Cu pattern 124 depicted in FIG. 3, the coverage is lower than that of a location at which the Cu pattern 282 is formed, in particular, that of a Cu pattern in other regions such as a location of the measuring region 252 or the like in that the coverage is substantially equal to or lower than 30% or the like.

Further, also in the logic wafer 233, a guard ring 284 and another guard ring 285 are formed from Cu or Al at a location in the proximity of the boundary of the dicing line 251 or the measuring region 252 at a location of the chip region 241 of the wiring line layer 267.

By configuring the semiconductor wafer 221 in such a manner as described above, the yield upon production of solid state image pickup devices can be improved more simply.

In particular, in the semiconductor wafer 221, the measuring region 252 is provided between the dicing line 251 and the chip region 241, and in the measuring region 252, pads for inspection such as the measurement pad 271 and the measurement pad 280 are arranged. Further, also a dummy wiring line of Cu is not arranged in a Global layer or a Semi Global layer of the dicing line 251, and the coverage of the Cu pattern 283 provided at the location of the dicing line 251 is set lower than that of a Cu pattern in any other region such as the measuring region 252.

Consequently, it is possible to eliminate a step on the dicing line 251 and decrease the volume of Cu thereby to prevent chipping to improve the yield of solid state image pickup devices. Besides, by forming the groove 274 at the location of the dicing line 251 of the sensor wafer 231, it is possible to further facilitate dicing processing.

Further, by reducing the volume of Cu in the dicing line 251, the generation of Cu silicide when laser ablation dicing is performed can be reduced and the yield of solid state image pickup devices can be improved.

Furthermore, by removing Si at the location of the dicing line 251 of the sensor wafer 231 before dicing processing, it is possible to prevent generation of Cu silicide thereby to improve the yield of solid state image pickup devices and obtain solid state image pickup devices of higher quality. Further, when laser ablation dicing is to be performed, the processing can be performed more simply and rapidly.

<Production of Solid State Image Pickup Device>

Now, production of a solid state image pickup device in the case where three semiconductor wafers are joined together to obtain one final semiconductor wafer as depicted in FIG. 5 is described with reference to FIGS. 6 and 7. It is to be noted that, in FIGS. 6 and 7, elements corresponding to each other are denoted by the same reference signs, and description of them is omitted suitably.

Figure 6:
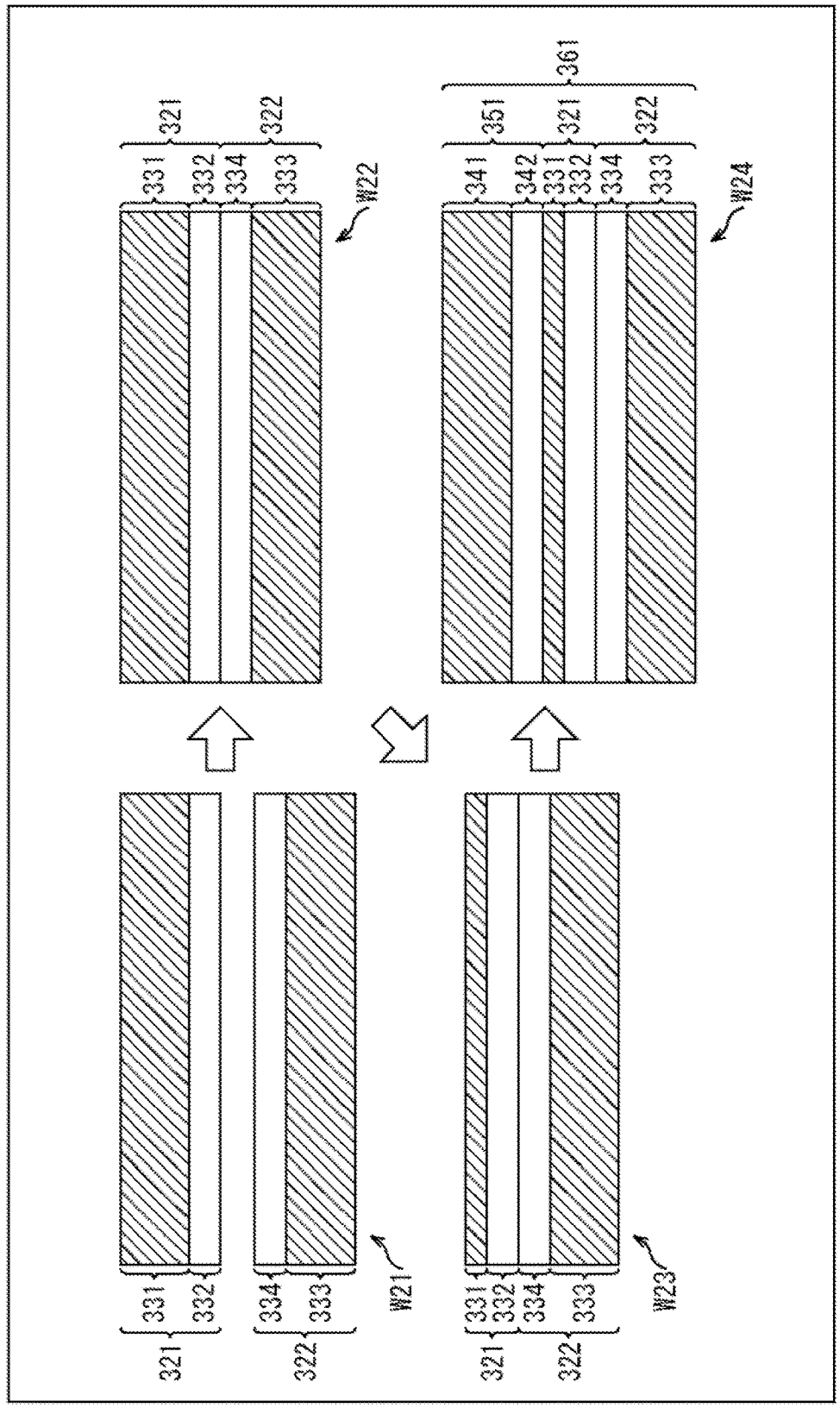
FIG. 6 is a view illustrating production steps of the solid state image pickup device.

A production apparatus for producing the solid state image pickup device first produces a DRAM wafer 321 and a logic wafer 322 as indicated by an arrow mark W21 in FIG. 6.

In particular, the production apparatus forms a wiring line layer 332 configured from one or a plurality of layers by stacking on a silicon substrate 331 to form one wafer including the silicon substrate 331 and the wiring line layer 332 as the DRAM wafer 321 that functions as a memory.

Here, the DRAM wafer 321, silicon substrate 331 and wiring line layer 332 correspond to the DRAM wafer 232, silicon substrate 264 and wiring line layer 265 depicted in FIG. 5, respectively.

Further, the production apparatus forms a wiring line layer 334 having wiring lines and so forth and configured from one or a plurality of layers on a silicon substrate 333 by stacking to form one wafer configured from the silicon substrate 333 and the wiring line layer 334 as the logic wafer 322.

Here, the logic wafer 322, silicon substrate 333 and wiring line layer 334 correspond to the logic wafer 233, silicon substrate 266 and wiring line layer 267 depicted in FIG. 5, respectively.

Then, the production apparatus joins the DRAM wafer 321 and the logic wafer 322 together by plasma bonding as indicated by an arrow mark W22. In the present example, the DRAM wafer 321 and the logic wafer 322 are joined together such that the wiring line layer 332 of the DRAM wafer 321 and the wiring line layer 334 of the logic wafer 322 are opposed to each other.

Thereafter, the production apparatus processes the surface of the silicon substrate 331, which configures the DRAM wafer 321, as indicated by an arrow mark W23 to form the silicon substrate 331 into a thinner layer.

Further, the production apparatus forms pixels each formed from a photoelectric conversion element and so forth on a silicon substrate 341 as indicated by an arrow mark W24. Furthermore, the production apparatus forms a wiring line layer 342, which has wiring lines and so forth and is formed from one or a plurality of layers, on the silicon substrate 341 by stacking to form one wafer configured from the silicon substrate 341 and the wiring line layer 342 as a sensor wafer 351. Here, the sensor wafer 351, silicon substrate 341 and wiring line layer 342 correspond to the sensor wafer 231, silicon substrate 261 and wiring line layer 262 depicted in FIG. 5, respectively.

Then, the production apparatus joins the sensor wafer 351 obtained in this manner and the DRAM wafer 321 to which the logic wafer 322 is joined together by plasma bonding to form one semiconductor wafer 361. In the present example, the sensor wafer 351 and the DRAM wafer 321 are joined together such that the wiring line layer 342 of the sensor wafer 351 and the silicon substrate 331 of the DRAM wafer 321 are opposed to each other.

Figure 7:
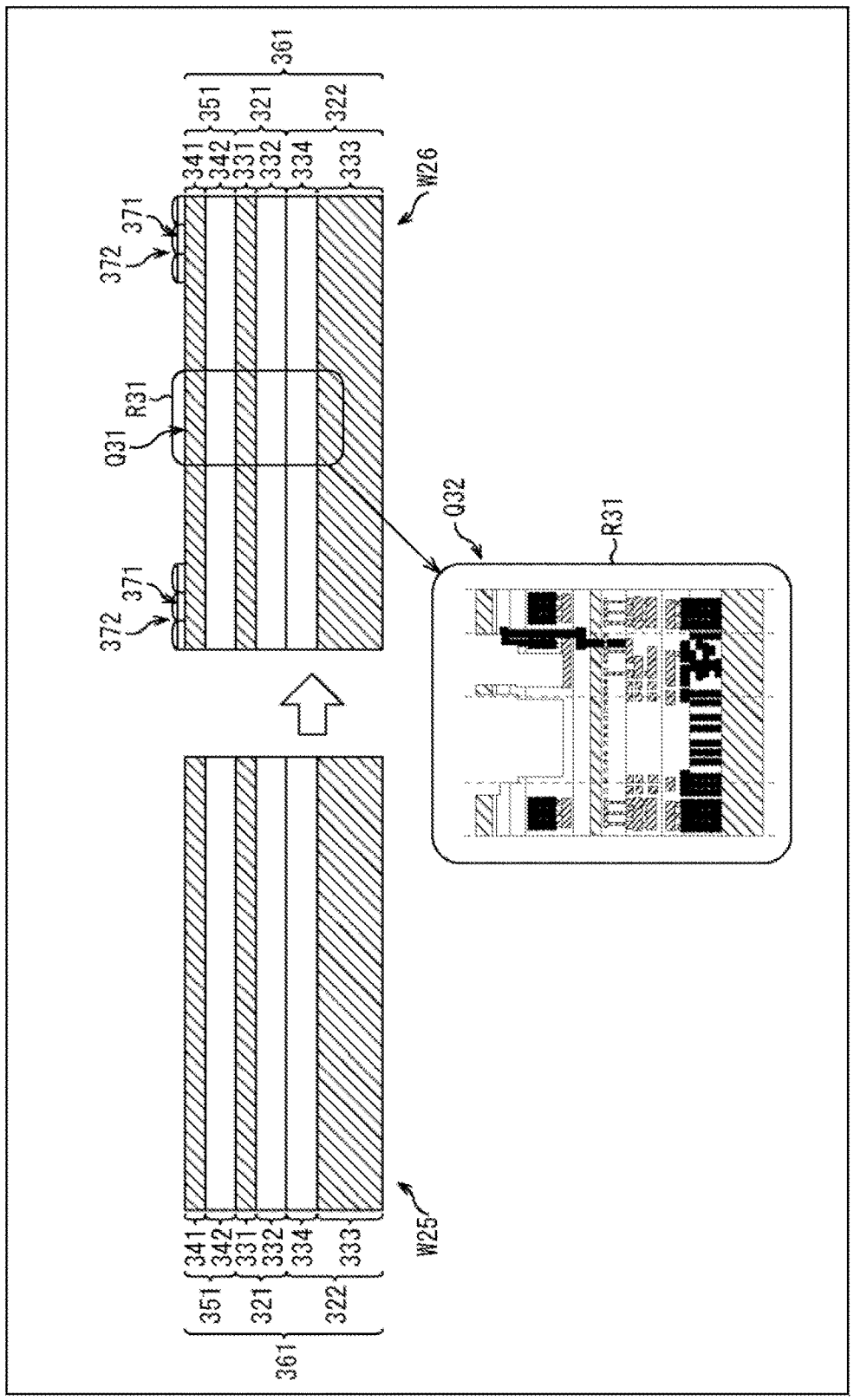
FIG. 7 is a view illustrating production steps of the solid state image pickup device.

Thereafter, the production apparatus processes the surface of the silicon substrate 341, which configures the semiconductor wafer 361, as indicated by an arrow mark W25 in FIG. 7 to form the silicon substrate 341 into a thinner layer.

Furthermore, the production apparatus forms, for each pixel, an on-chip color filter 371 and an on-chip color lens 372 that configure the pixel in a region of the semiconductor wafer 361 corresponding to the chip region 241 as indicated by an arrow mark W26.

Then, the production apparatus etches the location of the dicing line of the sensor wafer 351 to remove Si and forms an opening at a measuring region location of the sensor wafer 351 to open a measurement pad location. Consequently, a chip region, a measuring region and a dicing line are formed in the semiconductor wafer 361.

For example, a portion of the semiconductor wafer 361 indicated by an arrow mark Q31 is formed as a scribe region. In the present example, if the location of the scribe region, namely, the location of a region R31, is enlarged, the structure of the scribe region becomes a structure similar to that in the case indicated by the arrow mark A21 in FIG. 5 as indicated by an arrow mark Q32. In FIG. 7, a location indicated by the arrow mark Q32 is a location that indicates the location of the region R31 of the semiconductor wafer 361 in an enlarged scale.

After one semiconductor wafer 361 is obtained in this manner, the semiconductor wafer 361 is fragmented by dicing, and chips obtained as a result of the fragmentation become solid state image pickup devices. In the dicing, the location of the dicing line is cut as described hereinabove, and a chip configured from a chip region and a measuring region forms a solid state image pickup device. At this time, as occasion demands, the location of the measuring region is removed from the chip.

<Modification 1 to Second Embodiment>
<Arrangement of Inspection Circuit>

It is to be noted that, although, also in the semiconductor wafer 221 depicted in FIG. 5, a TEG corresponding to the inspection circuit 61 depicted in FIG. 1 is arranged in the measuring region 252, where there is the necessity to destroy the TEG by dicing for the object of confidence, the TEG may otherwise be formed on the dicing line 251.

Figure 8:
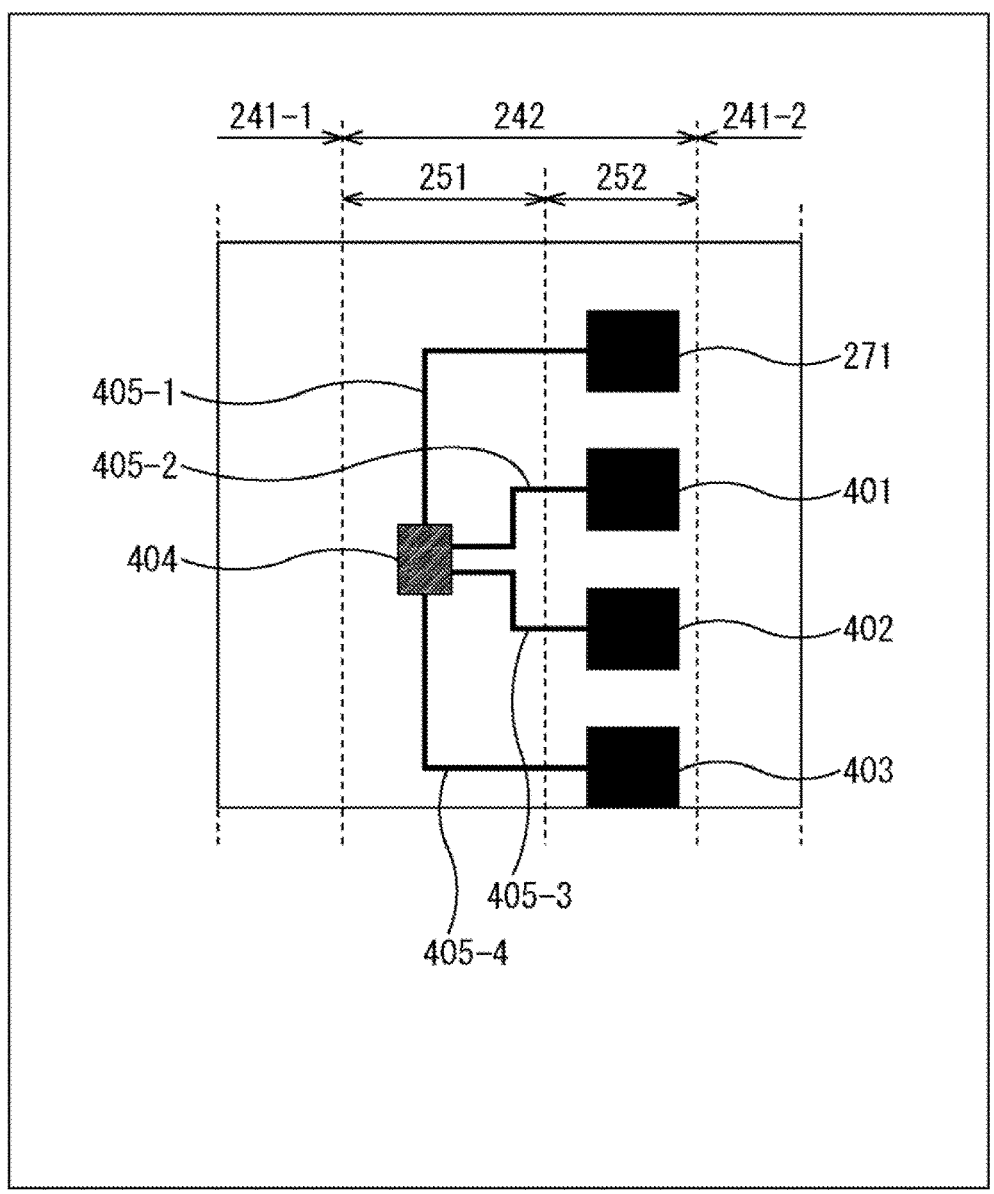
FIG. 8 is a view illustrating arrangement of an inspection circuit.

In such a case as just described, the scribe region 242 depicted in FIG. 5 is configured, for example, in such a manner as depicted in FIG. 8. It is to be noted that, in FIG. 8, elements corresponding to those in the case of FIG. 5 are denoted by the same reference signs, and description of them is omitted suitably.

FIG. 8 depicts a view when the semiconductor wafer 221 indicated by the arrow mark A21 in FIG. 5 is viewed in the downward direction from above in FIG. 5.

In the present example, at a location of the measuring region 252 of the wiring line layer 262 of the sensor wafer 231, a measurement pad 271 and measurement pads from a measurement pad 401 to a measurement pad 403 similar to the measurement pad 271 are formed.

Further, at a location of the dicing line 251 of the wiring line layer 265 of the DRAM wafer 232, an inspection circuit 404 as a TEG is formed. Further, the inspection circuit 404 and the measurement pad 271 and measurement pads from the measurement pad 401 to the measurement pad 403 are electrically connected to each other by wiring lines from a wiring line 405-1 to a wiring line 405-4 that are connection wiring lines.

In the following, where there is no necessity to particularly distinguish the wiring lines from the wiring line 405-1 to the wiring line 405-4 from each other, each of them can be referred to merely as wiring line 405.

In the present example, each wiring line 405 is a multilayer wiring line that is formed, for example, across the wiring line layer 262, silicon substrate 264 and wiring line layer 265 and connects the inspection circuit 404 and the measurement pad 271 and measurement pads from the measurement pad 401 to the measurement pad 403 to each other through a plurality of layers.

If the inspection circuit 404 is formed at a location of the dicing line 251 in this manner, since the inspection circuit 404 is destroyed upon dicing, the confidentiality can be improved. Besides, in this case, since the inspection circuit 404 is formed not on the sensor wafer 231 but on the DRAM wafer 232, there is no necessity to form a region of Si at the location of the dicing line 251 of the sensor wafer 231.

<Example of Configuration of Image Pickup Device>

Further, the present technology can be applied to general electronic equipment that use a solid state image pickup device in a photoelectric conversion unit thereof such as an image pickup apparatus such as a digital still camera, a video camera or the like, a portable terminal device that has an image pickup function, a copying machine that uses a solid state image pickup device in an image reading unit thereof and so forth.

Figure 9:
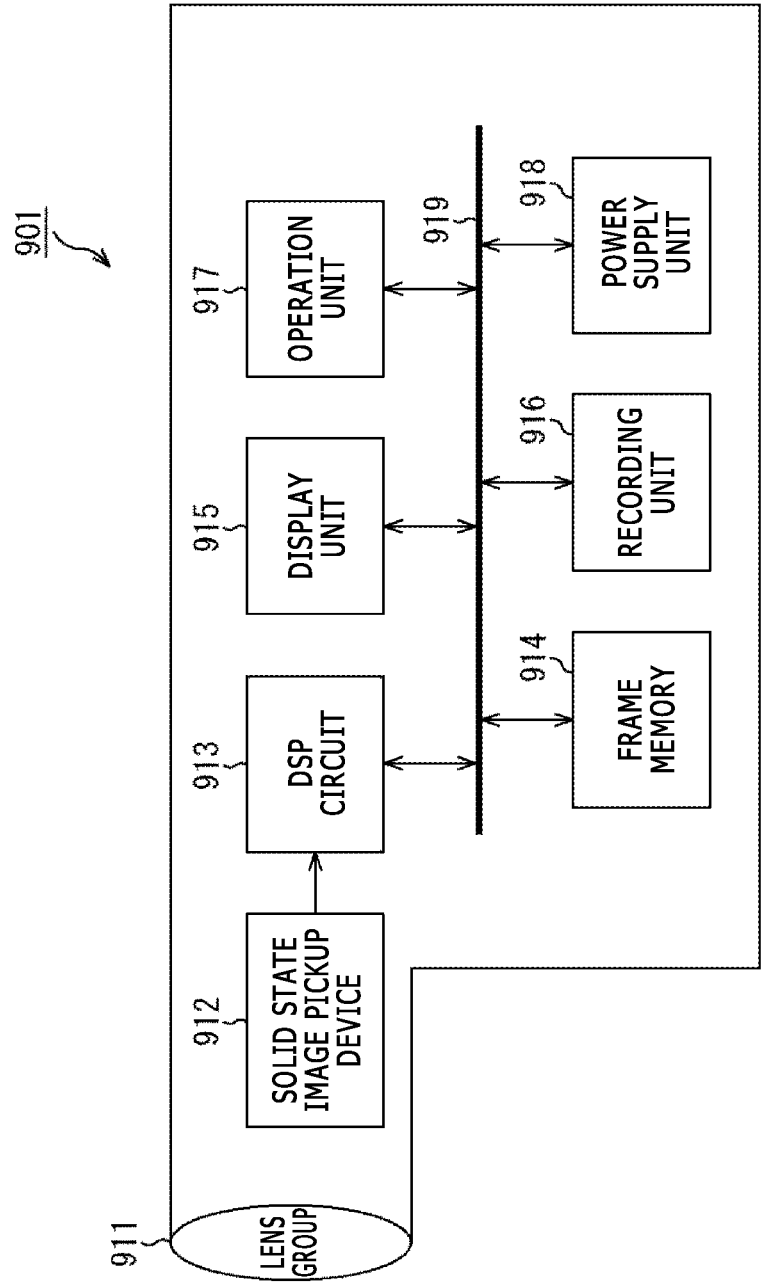
FIG. 9 is a view depicting an example of a configuration of an image pickup apparatus.

FIG. 9 is a view depicting an example of a configuration of an image pickup apparatus as an electronic apparatus to which the present technology is applied.

The image pickup apparatus 901 in FIG. 9 includes an optical unit 911 configured from a lens group and so forth, a solid state image pickup device (image pickup device) 912 and a DSP (Digital Signal Processor) circuit 913 that is a camera signal processing circuit. Further, the image pickup apparatus 901 includes a frame memory 914, a display unit 915, a recording unit 916, an operation unit 917 and a power supply unit 918 as well. The DSP circuit 913, frame memory 914, display unit 915, recording unit 916, operation unit 917 and power supply unit 918 are connected to each other by a bus line 919.

The optical unit 911 takes in incident light (image light) from an image pickup object and forms an image on an image pickup plane of the solid state image pickup device 912. The solid state image pickup device 912 converts the light amount of the incident light of the image formed on the image pickup plane by the optical unit 911 into an electric signal in a unit of a pixel and outputs the electric signal as a pixel signal. The solid state image pickup device 912 corresponds to the solid state image pickup device described hereinabove such as the solid state image pickup device 71 depicted in FIG. 2 or the like.

The display unit 915 is configured from a panel type display device such as, for example, a liquid crystal panel, an organic EL (Electro Luminescence) panel or the like and displays a moving image or a still image picked up by the solid state image pickup device 912. The recording unit 916 records a moving image or a still image picked up by the solid state image pickup device 912 on a recording medium such as a video tape, a DVD (Digital Versatile Disk) or the like.

The operation unit 917 issues an operation instruction for various functions the image pickup apparatus 901 has under an operation by a user. The power supply unit 918 suitably supplies various types of power that become operation power supplies for the DSP circuit 913, frame memory 914, display unit 915, recording unit 916 and operation unit 917 to those supply targets.

It is to be noted that the embodiments described hereinabove are described taking as an example a case in which the technology is applied to a CMOS image sensor in which pixels for detecting signal charge according to the light amount of visible light as a physical quantity are arranged in rows and columns. However, the present technology is not applied restrictively to a CMOS image sensor but can be applied to general solid state image pickup elements.

<Example of Use of Solid State Image Pickup Device>

Figure 10:
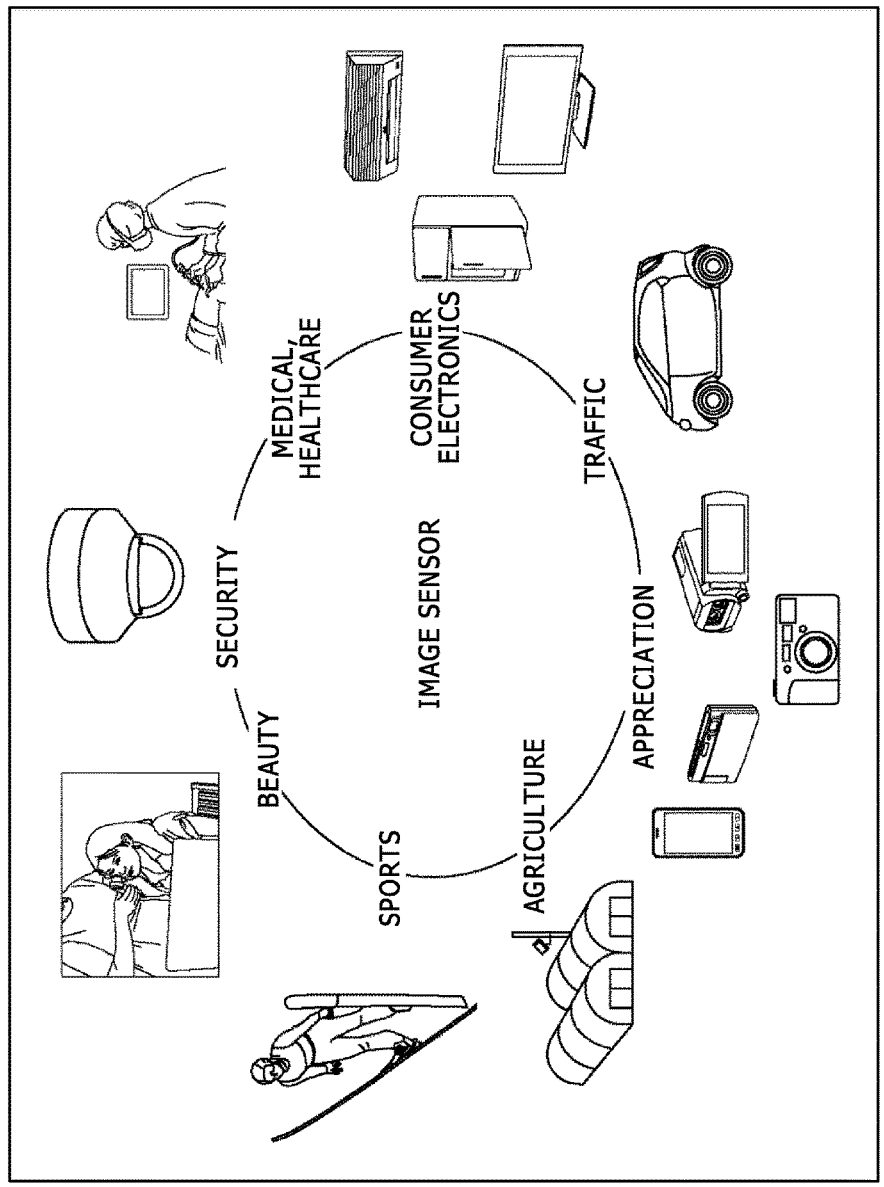
FIG. 10 is a view depicting examples of use in which the solid-state image pickup device is used.

FIG. 10 is a view depicting examples of use in which the solid state image pickup device (image sensor) described above is used.

The solid state image pickup device described hereinabove can be used in various cases in which light such as, for example, visible rays, infrared rays, ultraviolet rays, or X rays is to be sensed as described below.

Device for picking up an image to be used for appreciation such as a digital camera, a portable apparatus with a camera function and so forth.

Device that is used for traffic such as an automotive sensor for picking up an image of the front, the rear, the surroundings, the inside and so forth of an automobile, a surveillance camera for monitoring a traveling vehicle or a road, a distance measurement sensor for performing measurement of the distance between vehicles and so forth for the object of safe driving such as automatic stopping and so forth, recognition of a state of the driver and so forth Device that is used in consumer electronics such as a TV, a refrigerator, an air conditioner and so forth in order to pick up an image of a gesture of a user and perform an apparatus operation in accordance with the gesture Device that is used for a medical use or a healthcare use such as an endoscope, a device for performing blood vessel image pickup by reception of infrared rays or the like Device used for the security such as a surveillance camera for crime prevention applications, a camera for people authentication purposes or the like Device used for beauty such as a skin measuring instrument for picking up an image of the skin, a microscope for picking up an image of the scalp or the like Device used for applications of sports such as an action camera for sport applications and so forth, a wearable camera or the like Device used for agricultural applications such as a camera for monitoring a state of a field or crops or the like Further, the embodiment of the present technology is not limited to the embodiments described hereinabove and various alterations can be made without departing from the subject matter of the present technology.

Furthermore, also it is possible for the present technology to have such configurations as described below.

[1]

A solid state image pickup device including:

a chip region in which a plurality of pixels and elements for driving the pixels are provided; and a measuring region that is provided in a neighboring relationship with the chip region and in which the elements and wiring lines necessary for driving of the pixels are not provided but measurement pads for measuring a property of the chip region therethrough are provided.

[2]

The solid state image pickup device according to [1], wherein, in the measuring region, connection wiring lines for connecting an inspection circuit for measuring the property and the measurement pads to each other are further provided.

[3]

The solid state image pickup device according to [2], wherein, in the measuring region, the inspection circuit is further provided.

[4]

A production method for a solid state image pickup device that includes a chip region in which a plurality of pixels and elements for driving the pixels are provided; and a measuring region that is provided in a neighboring relationship with the chip region and in which the elements and wiring lines necessary for driving of the pixels are not provided but measurement pads for measuring a property of the chip region therethrough are provided;

the production method including the steps of:

forming, on a semiconductor wafer, a plurality of regions including the chip region and the measuring region and a dicing line that partitions the plurality of regions from each other; and performing a dicing process for the dicing line to fragment the semiconductor wafer into the solid state image pickup device configured from the chip region and the measuring region.

[5]

The production method according to [4], wherein the semiconductor wafer is configured from a sensor wafer on which the pixels are provided and one or a plurality of different wafers different from the sensor wafer; and the dicing process is performed after silicon at the dicing line location of the sensor wafer is removed.

[6]

The production method according to [4] or [5], wherein, in the measuring region, an inspection circuit for measuring the property is further provided.

[7]

The production method according to [5], wherein, at the dicing line location of each of the different wafers, an inspection circuit for measuring the property is further provided.

[8]

The production method according to any one of [4] to [7], wherein a coverage of copper in the dicing line is lower than a coverage of copper in a region different from the dicing line.

[9]

A semiconductor wafer including:

a chip region in which a plurality of pixels and elements for driving the pixels are provided;

a measuring region that is provided in a neighboring relationship with the chip region and in which the elements and wiring lines necessary for driving of the pixels are not provided but measurement pads for measuring a property of the chip region therethrough are provided; and a dicing line that partitions a plurality of regions including the chip region and the measuring region.

[10]

The semiconductor wafer according to [9], wherein the semiconductor wafer is configured from a sensor wafer on which the pixels are provided and one or a plurality of different wafers different from the sensor wafer; and the dicing line location of the sensor wafer is in a state in which silicon is removed therefrom.

[11]

The semiconductor wafer according to [9] or [10], wherein, in the measuring region, an inspection circuit for measuring the property is further provided.

[12]

The semiconductor wafer according to [10], wherein, at the dicing line location of each of the different wafers, an inspection circuit for measuring the property is further provided.

[13]

The semiconductor wafer according to any one of [9] to [12], wherein a coverage of copper in the dicing line is lower than a coverage of copper in a region different from the dicing line.

[14]

An electronic apparatus including a solid state image pickup device, which includes:

a chip region in which a plurality of pixels and elements for driving the pixels are provided; and a measuring region that is provided in a neighboring relationship with the chip region and in which the elements and wiring lines necessary for driving of the pixels are not provided but measurement pads for measuring a property of the chip region therethrough are provided.

REFERENCE SIGNS LIST

11 Semiconductor wafer, 21-1 to 21-6, 21 Chip region, 22 Scribe region, 51 Dicing line, 52 Measuring region, 61 Inspection circuit, 62-1 to 62-6, 62 Measurement pad, 71 Solid state image pickup device, 122 Cu pattern, 123 Cu pattern, 124 Cu pattern, 271 Measurement pad, 274 Groove, 404 Inspection circuit, 405-1 to 405-4, 405 Wiring line

What is claimed is:

1. A solid state image pickup device comprising:
    a chip region in which a plurality of pixels and elements for driving the pixels are provided; and
    a measuring region that is provided in a neighboring relationship with the chip region and in which the elements and wiring lines necessary for driving of the pixels are not provided but measurement pads for measuring a property of the chip region therethrough are provided; and
    a dicing line that partitions a plurality of regions including the chip region and the measuring region, wherein the dicing line includes copper and a coverage of copper at a location of the dicing line is lower than a coverage of copper in a region not including the dicing line.

2. The solid state image pickup device according to claim 1, wherein, in the measuring region, connection wiring lines for connecting an inspection circuit for measuring the property and the measurement pads to each other are further provided.

3. The solid state image pickup device according to claim 2, wherein, in the measuring region, the inspection circuit is further provided.

4. A production method for a solid state image pickup device that includes
    a chip region in which a plurality of pixels and elements for driving the pixels are provided, and
    a measuring region that is provided in a neighboring relationship with the chip region and in which the elements and wiring lines necessary for driving of the pixels are not provided but measurement pads for measuring a property of the chip region therethrough are provided;
    the production method comprising the steps of:
        forming, on a semiconductor wafer, a plurality of regions including the chip region and the measuring region and a dicing line that partitions the plurality of regions from each other, wherein a coverage of copper at a location of the dicing line is lower than a coverage of copper in a region different from the dicing line; and
        performing a dicing process for the dicing line to fragment the semiconductor wafer into the solid state image pickup device configured from the chip region and the measuring region.

5. The production method according to claim 4,
    wherein the semiconductor wafer is configured from a sensor wafer on which the pixels are provided and one or a plurality of different wafers different from the sensor wafer; and
    the dicing process is performed after silicon at the dicing line location of the sensor wafer is removed.

6. The production method according to claim 4, wherein, in the measuring region, an inspection circuit for measuring the property is further provided.

7. The production method according to claim 5, wherein, at the dicing line location of each of the different wafers, an inspection circuit for measuring the property is further provided.

8. A semiconductor wafer comprising:
a chip region in which a plurality of pixels and elements for driving the pixels are provided;
a measuring region that is provided in a neighboring relationship with the chip region and in which the elements and wiring lines necessary for driving of the pixels are not provided but measurement pads for measuring a property of the chip region therethrough are provided; and
a dicing line that partitions a plurality of regions including the chip region and the measuring region, wherein the dicing line includes copper and a coverage of copper in a location of the dicing line is lower than a coverage of copper in a region different from the dicing line.

9. The semiconductor wafer according to claim 8, wherein the semiconductor wafer is configured from a sensor wafer on which the pixels are provided and one or a plurality of different wafers different from the sensor wafer; and
the dicing line location of the sensor wafer is in a state in which silicon is removed therefrom.

10. The semiconductor wafer according to claim 8, wherein, in the measuring region, an inspection circuit for measuring the property is further provided.

11. The semiconductor wafer according to claim 9, wherein, at the dicing line location of each of the different wafers, an inspection circuit for measuring the property is further provided.

12. An electronic apparatus comprising:
a solid state image pickup device, which includes:
a chip region in which a plurality of pixels and elements for driving the pixels are provided;
a measuring region that is provided in a neighboring relationship with the chip region and in which the elements and wiring lines necessary for driving of the pixels are not provided but measurement pads for measuring a property of the chip region therethrough are provided; and
a dicing line that partitions a plurality of regions including the chip region and the measuring region, wherein the dicing line includes copper and a coverage of copper at a location of the dicing line is lower than a coverage of copper at a location of a region different from the dicing line.

13. The solid state image pickup device according to claim 1, wherein the region not including the dicing line includes the measuring region.

14. The solid state image pickup device according to claim 1, wherein the region not including the dicing line is the measuring region.

15. The production method according to claim 4, wherein the region different from the dicing line includes the measuring region.

16. The production method according to claim 4, wherein the region different from the dicing line is the measuring region.

17. The semiconductor wafer according to claim 8, wherein the region different from the dicing line includes the measuring region.

18. The semiconductor wafer according to claim 8 wherein the region different from the dicing line is the measuring region.

19. The electronic apparatus of claim 12, wherein the region different from the dicing line includes the measuring region.

20. The electronic apparatus of claim 12, wherein the region different from the dicing line is the measuring region.

* * * * *